(12) United States Patent
Wong et al.

(10) Patent No.: US 10,992,268 B2
(45) Date of Patent: Apr. 27, 2021

(54) RADIO FREQUENCY AMPLIFICATION DEVICE CAPABLE OF DETECTING THE FREQUENCY BAND

(71) Applicant: RichWave Technology Corp., Taipei (TW)

(72) Inventors: Shyh-Chyi Wong, Taipei (TW); Cheng-Min Lin, Taipei (TW)

(73) Assignee: RichWave Technology Corp., Taipei (TW)

( * ) Notice: Subject to any disclaimer, the term of this patent is extended or adjusted under 35 U.S.C. 154(b) by 43 days.

(21) Appl. No.: 16/571,182

(22) Filed: Sep. 15, 2019

(65) Prior Publication Data

US 2020/0127615 A1 Apr. 23, 2020

(30) Foreign Application Priority Data

Oct. 22, 2018 (TW) .................................. 107137234

(51) Int. Cl.
*H03F 3/191* (2006.01)
*H03F 1/56* (2006.01)
*H03F 1/02* (2006.01)

(52) U.S. Cl.
CPC .......... *H03F 1/565* (2013.01); *H03F 1/0222* (2013.01); *H03F 2200/165* (2013.01); *H03F 2200/387* (2013.01); *H03F 2200/451* (2013.01)

(58) Field of Classification Search
CPC ...................................................... H03F 3/191

USPC .................................................. 330/302, 305
See application file for complete search history.

(56) References Cited

U.S. PATENT DOCUMENTS

| | | | | |
|---|---|---|---|---|
| 7,733,187 B2* | 6/2010 | Tateoka | ................. | H03F 3/191 |
| | | | | 330/302 |
| 9,615,121 B2* | 4/2017 | Tanaka | ................... | H04H 40/00 |
| 9,851,384 B2 | 12/2017 | van Bezooijen | | |

* cited by examiner

*Primary Examiner* — Henry Choe
(74) *Attorney, Agent, or Firm* — Winston Hsu

(57) ABSTRACT

A radio frequency signal amplification device includes an amplification circuit, an impedance matching circuit, a frequency detection circuit, and a control circuit. The amplification circuit has an input terminal and an output terminal. The amplification circuit amplifies a radio frequency (RF) signal received from the input terminal, and generates an amplified radio frequency signal to the output terminal. The impedance matching circuit is coupled to the input terminal or the output terminal of the amplification circuit. The impedance matching circuit receives the radio frequency signal and provides an impedance matching the radio frequency signal, or receives the amplified radio frequency signal and provides an impedance matching the amplified radio frequency signal. The frequency detection circuit determines a frequency band to which the radio frequency signal belongs. The control circuit adjusts the impedance of the impedance matching circuit according to the frequency band.

23 Claims, 10 Drawing Sheets

RADIO FREQUENCY AMPLIFICATION DEVICE CAPABLE OF DETECTING THE FREQUENCY BAND

CROSS REFERENCE TO RELATED APPLICATION

This application claims priority of Taiwan application No. 107137234, which was filed on Oct. 22, 2018, and is included herein by reference.

TECHNICAL FIELD

The present invention is related to a radio frequency amplification device, and more particularly, to a radio frequency amplification device capable of detecting the frequency band of the radio frequency signal and adjusting internal parameters accordingly.

BACKGROUND

With the popularity of networks and mobile devices, the demand for wireless communication is increasing, and the radio frequency (RF) signal amplifier is a key component in wireless communication systems. The RF signal amplifier can amplify the RF signal of a specific frequency, so that the RF signal can be stably received and the information therein can be parsed, thereby achieving the purpose of wireless communication. However, different types of wireless communications often use different frequency bands for transmission to avoid mutual interference, and for Wi-Fi wireless transmission, there are even two different frequency bands of 2.4G Hz and 5G Hz used.

Generally, to meet the needs of different types of wireless communication, the RF signal amplifier must cooperate with different impedance matching circuits to receive the RF signals of the desired frequency bands. In addition, the required gain and operating power of the RF signal amplifier are also varied with different types of wireless communications. Therefore, in the prior art, the electronic device needs to include a plurality of different RF signal amplifiers to process different types of RF signals, which increases the circuit area. Furthermore, with the development of technology or with different application fields, the frequency bands required for wireless communication may also be different; therefore, the RF signal amplifier in the electronic device has to be redesigned according to the change of the frequency bands, resulting in a huge manpower burden and time cost.

SUMMARY

One embodiment of the present invention discloses a radio frequency signal amplification device. The radio frequency signal amplification device includes a first amplification circuit, a first impedance matching circuit, a frequency detection circuit, and a control circuit.

The first amplification circuit has an input terminal and an output terminal. The first amplification circuit amplifies a radio frequency (RF) signal received from the input terminal, and generates a first amplified radio frequency signal to the output terminal. The first impedance matching circuit is coupled to the input terminal or the output terminal of the first amplification circuit. The first impedance matching circuit receives the radio frequency signal and provides an impedance matching the radio frequency signal, or receives the first amplified radio frequency signal and provides an impedance matching the first amplified radio frequency signal. The frequency detection circuit determines a frequency band to which the radio frequency signal belongs. The control circuit adjusts the impedance of the first impedance matching circuit according to the frequency band.

Another embodiment of the present invention discloses a radio frequency front-end module. The radio frequency front-end module includes a transmitting terminal, a receiving terminal, a common terminal, a switch circuit, and a radio frequency signal amplification device.

The switch circuit is coupled to the transmitting terminal, the receiving terminal, and the common terminal. The switch circuit selectively couples the common terminal to the transmitting terminal or the receiving terminal.

The radio frequency signal amplification device is coupled between the switch circuit and the transmitting terminal or between the switch circuit and the receiving terminal. The radio frequency signal amplification device includes an amplification circuit, an impedance matching circuit, a frequency detection circuit, and a control circuit.

The amplification circuit has an input terminal and an output terminal. The amplification amplifies a radio frequency (RF) signal received from the input terminal, and generates an amplified radio frequency signal to the output terminal. The impedance matching circuit is coupled to the input terminal or the output terminal of the amplification circuit. The impedance matching circuit receives the radio frequency signal and provides an impedance matching the radio frequency signal, or receives the amplified radio frequency signal and provides an impedance matching the amplified radio frequency signal. The frequency detection circuit determines a frequency band to which the radio frequency signal belongs. The control circuit adjusts the impedance of the impedance matching circuit according to the frequency band.

DETAILED DESCRIPTION

Figure 1:
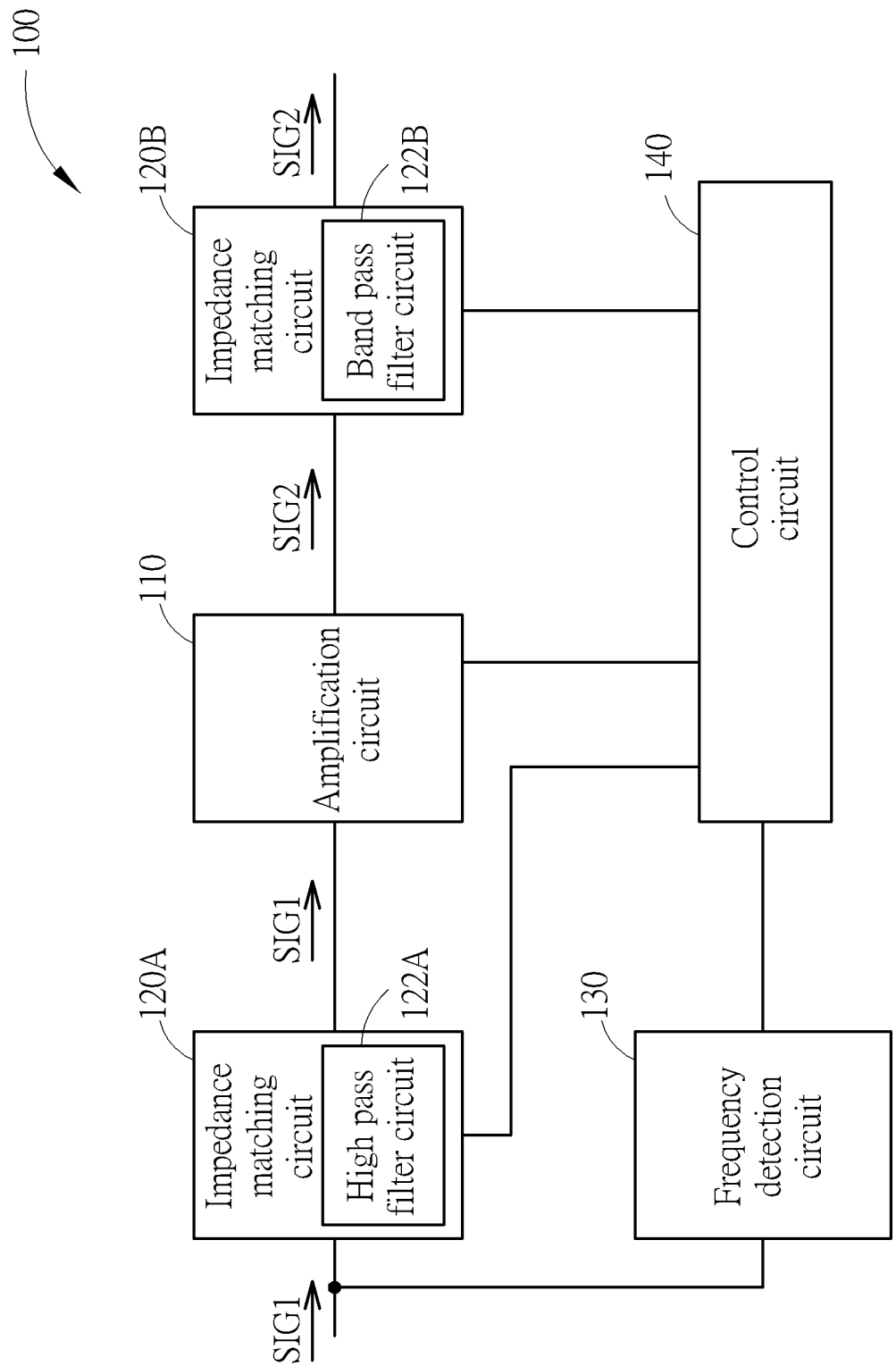
FIG. 1 shows a radio frequency signal amplification device according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a radio frequency signal amplification device 100 according to one embodiment of the present invention. The radio frequency signal amplification device 100 includes an amplification circuit 110, impedance matching circuits 120A and 120B, a frequency detection circuit 130, and a control circuit 140.

The amplification circuit 110 has an input terminal and an output terminal. The amplification circuit 110 can receive a RF signal SIG1 from the input terminal, and amplify the RF signal SIG1 to output an amplified RF signal SIG2 through the output terminal. In some embodiments, the amplification circuit 110 can include a power amplifier (PA) or a low noise amplifier (LNA).

The impedance matching circuit 120A can be coupled to the input terminal of the amplification circuit 110. The impedance matching circuit 120A can provide an impedance matching the RF signal SIG1, and thus can receive the RF signal inputted from the external accordingly, introducing the RF signal SIG1 to the input terminal of the amplification circuit 110. The impedance matching circuit 120B can be coupled to the output terminal of the amplification circuit 110. The impedance matching circuit 120B can provide an impedance matching the first amplified RF signal SIG2 so as to receive the amplified RF signal SIG2 and let the amplified RF signal SIG2 pass. That is, with the impedance matching circuits 120A and 120B, the RF signal amplification device 100 can ensure that the RF signal SIG1 can be introduced to the amplification circuit 110 accordingly and the amplified RF signal SIG2 generated by the amplification circuit 110 can be outputted smoothly. In some other embodiments, one of the impedance matching circuit 120A and 120B of the RF signal amplification device 100 can be omitted.

In some other embodiments, to support RF signals of different frequency bands, the RF signal amplification device 100 can use the frequency detection circuit 130 to determine the frequency band to which the RF signal SIG1 belongs. In some embodiments, the frequency detection circuit 130 can determine which primary band to which the RF signal SIG1 belong, for example, 2.4G or 2.5G. However, in some other embodiments, the frequency detection circuit 130 can further determine which sub channel of the primary band to which the RF signal SIG1 belong. The control circuit 140 can adjust the impedances of the impedance matching circuits 120A and 120B according to the frequency band to which the RF signal SIG1 belongs.

For example, in FIG. 1, the impedance matching circuit 120A can include a high pass filter circuit 122A to filter out the low frequency noises, and the impedance matching circuit 120B can include a band pass filter circuit 122B to further filter out noises outside the frequency band to which the amplified RF signal SIG2 belongs, thereby assisting the RF signal amplification device 100 to output the amplified RF signal SIG2.

Figure 2:
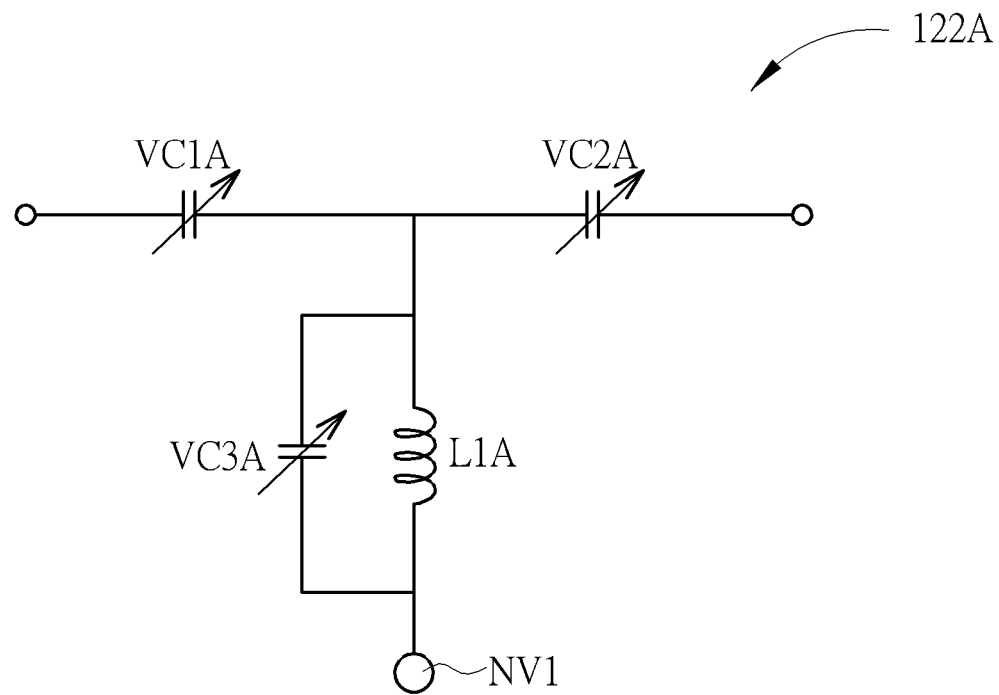
FIG. 2 shows the high pass filter circuit in FIG. 1 according to one embodiment of the present invention.
Figure 3:
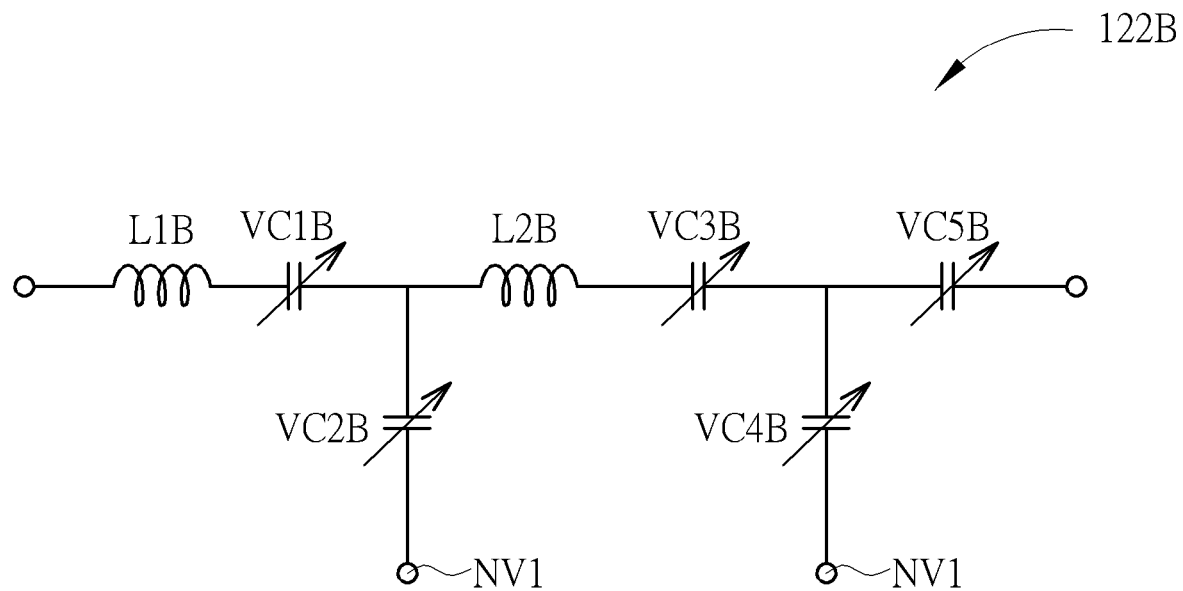
FIG. 3 shows the band pass filter circuit in FIG. 1 according to one embodiment of the present invention.

FIG. 2 shows the high pass filter circuit 122A according to one embodiment of the present invention, and FIG. 3 shows the band pass filter circuit 122B according to one embodiment of the present invention. In FIG. 2, the high pass filter circuit 122A includes capacitors VC1A, VC2A and VC3A, and an inductor L1A. The capacitors VC1A, VC2A and VC3A can be, for example, variable capacitors. The capacitor VC1A has a first terminal and second terminal. The capacitor VC2A has a first terminal coupled to the second terminal of the capacitor VC1A, and second terminal. The inductor L1A has first terminal coupled to the second terminal of the capacitor VC1A, and a second terminal coupled to the first system voltage terminal NV1. The first system voltage terminal NV1 can receive a base voltage of the system, for example, but not limited to, the ground voltage. The capacitor VC3A can be coupled in parallel with the inductor L1A. In this case, the control circuit 140 can adjust the impedance of the high pass filter circuit 122A by adjusting the capacitances of the capacitors VC1A, VC2A and VC3A, so the impedance matching circuit 120A can provide the required impedance that matches the RF signal SIG1. In some embodiments, one or more capacitors of the capacitors VC1A, VC2A and VC3A can be variable capacitors. Also, in some embodiments, the variable capacitor can include a switch coupled in series with a capacitor, and can further include a capacitor coupled in parallel with the switch and the capacitor that are coupled in series.

In FIG. 3, the band pass filter circuit 122B can include inductors L1B and L2B, and capacitors VC1B, VC2B, VC3B, VC4B, and VC5B. The inductor L1B has a first terminal and a second terminal. The capacitors VC1B, VC2B, VC3B, VC4B, and VC5B can be, for example, variable capacitors. The capacitor VC1B has a first terminal coupled to the second terminal of the inductor L1B, and a second terminal. The capacitor VC2B has a first terminal coupled to the second terminal of the capacitor VC1B, and a second terminal coupled to the first system voltage terminal NV1. The inductor L2B has a first terminal coupled to the second terminal of the capacitor VC1B, and a second terminal. The capacitor VC3B has a first terminal coupled to the second terminal of the inductor L2B, and a second terminal. The capacitor VC4B has a first terminal coupled to the second terminal of the capacitor VC3B, and a second terminal coupled to the first system voltage terminal NV1. The capacitor VC5B has a first terminal coupled to the second terminal of the capacitor VC3B, and a second terminal. In this case, the control circuit 140 can adjust the impedance of the band pass filter circuit 122B by adjusting the capacitances of the capacitors VC1B, VC2B, VC3B, VC4B, and VC5B, so the impedance matching circuit 120B can provide the required impedance that matches the amplified RF signal SIG2. In some other embodiments, one or more of the capacitors VC1B, VC2B, VC3B, VC4B, and VC5B can be variable capacitors.

Figure 4:
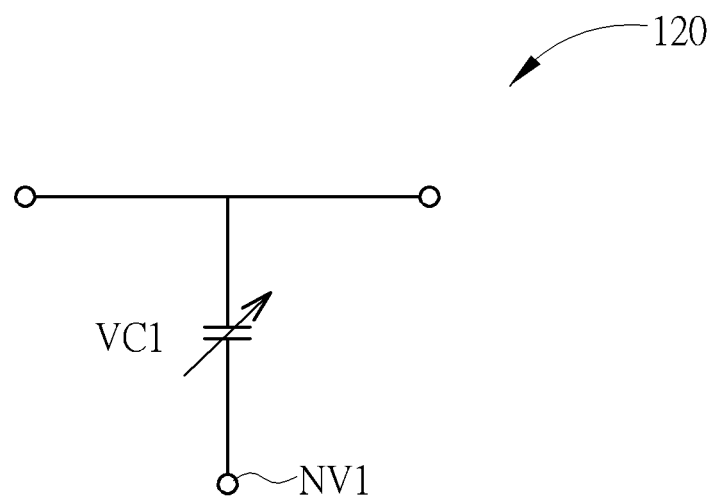
FIG. 4 shows an impedance matching circuit according to another embodiment of the present invention.
Figure 5:
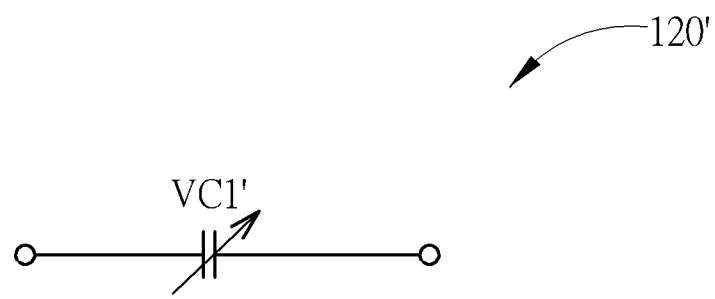
FIG. 5 shows an impedance matching circuit according to another embodiment of the present invention.

However, the impedance matching circuits 120A and 120B of the present invention are not limited to adopting the high pass filter circuit 122A in FIG. 2 and the band pass filter circuit 122B in FIG. 3. In some other embodiments, the impedance matching circuits 120A and 120B can be implemented by other structures. For example, FIG. 4 shows an impedance matching circuit 120 according to one embodiment of the present invention, and FIG. 5 shows an impedance matching circuit 120' according to one embodiment of the present invention. In some embodiments, the impedance matching circuits 120A and 120B can be implemented by the impedance matching circuit 120 shown in FIG. 4 and the impedance matching circuit 120' shown in FIG. 5 when the operating condition permits.

In FIG. 4, the impedance matching circuit 120 can include an input terminal, an output terminal, and a variable capacitor VC1. The variable capacitor VC1 has a first terminal coupled to the input terminal and output terminal of the impedance matching circuit 120, and a second terminal coupled to the first system voltage terminal NV1. In this case, the control circuit 140 can adjust the capacitance of the variable capacitor VC1 according to the frequency band to which the RF signal SIG1 belongs, and thereby adjusting the impedance of the impedance matching circuit 120.

In FIG. 5, the impedance matching circuit 120' can include an input terminal, an output terminal, and a variable capacitor VC1'. The variable capacitor VC1' has a first terminal coupled to the input terminal of the impedance matching circuit 120', and a second terminal coupled to the output terminal of the impedance matching circuit 120'. In this case, the control circuit 140 can adjust the capacitance of the variable capacitor VC1' according to which the frequency band the RF signal SIG1 belongs, and thereby adjusting the impedance of the impedance matching circuit 120'.

In some embodiments, the control circuit 140 can not only adjust the matching impedance of the RF signal amplification device 100 according the frequency band to which the RF signal SIG1 belongs, but also adjust the gain, the harmonic filtering frequency, the noise filtering frequency or the combination of the aforementioned parameters of the RF signal amplification device 100.

For example, in FIG. 1, the amplification circuit 110 of the RF signal amplification device 100 can include a plurality of amplifiers, and the control circuit 140 can enable a predetermined number of amplifiers according to the frequency band to which the RF signal SIG1 belongs to and/or the operation mode of the RF signal amplification device 100. That is, the control circuit 140 can adjust the number of the amplifiers to be enabled in the amplification circuit 110 according to the frequency band to which the RF signal SIG1 belongs and/or the operation mode of the RF signal amplification device 100, thereby adjusting the operating power and the gain of the RF signal amplification device 100.

Figure 6:
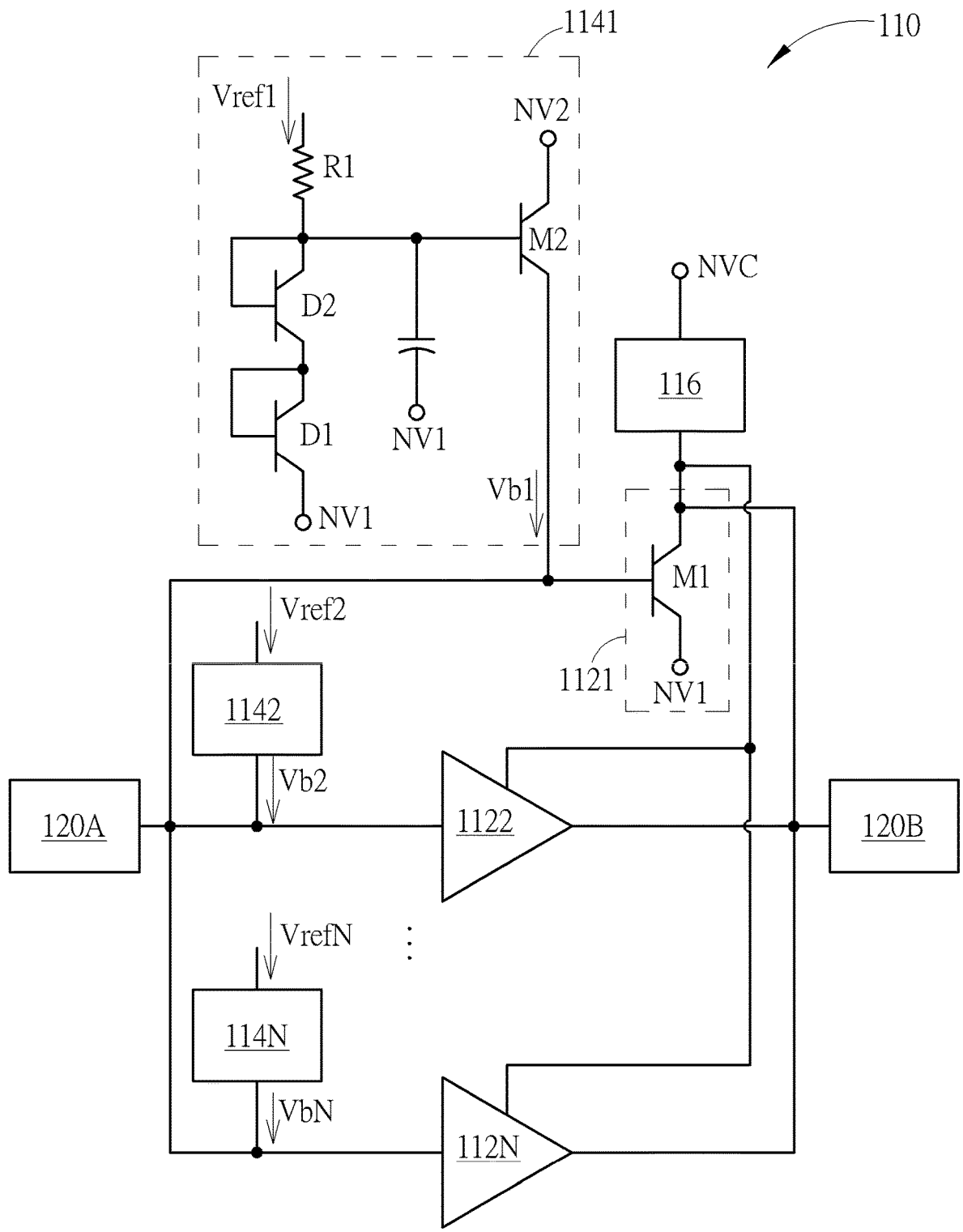
FIG. 6 shows the amplification circuit in FIG. 1 according to one embodiment of the present invention.

FIG. 6 shows the amplification circuit 110 according to one embodiment of the present invention. In FIG. 6, the amplification circuit 110 can include a plurality of amplifiers 1121 to 112N, and a plurality of bias circuits 1141 to 114N. The bias circuits 1141 to 114N can provide the bias voltages Vb1 to VbN required by the amplifiers 1121 to 112N according to the reference voltages Vref1 to VrefN. By supplying the reference voltages to the corresponding bias circuits, the control circuit 140 can control whether to enable the corresponding amplifiers or not. For example, the control circuit 140 can provide the reference voltage Vref1 and Vref2 to the bias circuits 1141 and 1142 without providing the reference voltages to other bias circuits. In this case, since only the bias circuits 1141 and 1142 can generate the bias voltages Vb1 and Vb2 correspondingly, only the amplifiers 1121 and 1122 will be enabled, and the other amplifiers will not be enabled. Consequently, the control circuit 140 can control and enable the amplifiers by providing the reference voltages to the corresponding bias circuits.

In some embodiments, the reference voltage Vref1 to VrefN provided by the control circuit 140 can have the same voltage value; however, the present invention is not limited to providing the reference voltages of the same voltage value. Also, the control circuit 140 can adjust the voltage values of the reference voltage Vref1 to VrefN received by the bias circuits 1141 to 114N according to the frequency band to which the RF signal SIG1 belongs and/or the operating mode of the RF amplification device 100. Generally, when the bias voltages Vb1 to VbN received by the amplifiers 1121 to 112N are different, the linearity and the efficiency of the amplifiers 1121 to 112N may also be different. For example, when receiving a rather low bias voltage, the linearity of the amplifiers 1121 to 112N may be poor while the output efficiency may be better. Contrarily, when receiving a rather high bias voltage, the linearity of the amplifiers 1121 to 112N may be better while the output efficiency may become poor. Therefore, by adjusting the voltage values of the reference voltages Vref1 to VrefN, the bias voltages Vb1 to VbN generated by the bias circuits 1141 to 114N can be adjusted, and thereby the controlling the operating status of the enabled amplifiers.

In some embodiments, the control circuit 140 can provide the same reference voltage to part of the bias circuits 1141 to 114N for enabling the corresponding amplifiers. However, the present invention is not limited to providing the reference voltages of the same voltage value for enabling the amplifiers. In some other embodiments, for example, when the amplification circuit 110 needs different types of amplifiers to work together, some of the bias circuits 1141 to 114N may receive different reference voltages. For example, the reference voltage Vref1 and Vref2 received by the bias circuits 1141 and 1142 may have different voltage values. In this case, the amplifiers 1121 and 1122 will be enabled by different bias voltages Vb1 and Vb2, and will be operated under different conditions.

In FIG. 6, the amplification circuit 110 can further include a radio frequency choke (RFC) 116. The RFC 116 has a first terminal coupled to the power signal terminal NVC, and a second terminal. The power signal terminal NVC can receive, for example, the operation voltage of the system. In addition, each of the amplifiers 1121 to 112N has an input terminal coupled to the impedance matching circuit 120A, and an output terminal coupled to the second terminal of the RFC 116 and the impedance matching circuit 120B.

In addition, in FIG. 6, the amplifiers 1121 to 112N can have the same structure. For example, the amplifier 1121 can include a transistor M1 having a first terminal coupled to the output terminal of the amplifier 1121, a second terminal coupled to the first system voltage terminal NV1, and a control terminal coupled to the input terminal of the amplifier 1121.

Furthermore, the bias circuits 1141 to 114N can have the same structure. For example, the bias circuit 1141 can include diodes D1 and D2, a resistor R1, and a transistor M2. The diode D1 has a first terminal, and a second terminal coupled to the first system voltage terminal NV1. The diode D2 has a first terminal, and a second terminal coupled to the first terminal of the diode D1. The resistor R1 has a first terminal coupled to the reference voltage terminal, and a second terminal coupled to the first terminal of the diode D2. The reference voltage terminal can receive the reference voltage Vref1 in the corresponding period according to the control of the control circuit 140. The transistor M2 has a first terminal coupled to the second system voltage terminal NV2 for receiving another operation voltage of the system, a second terminal for outputting the bias voltage Vb1, and a control terminal coupled to the first terminal of the diode D2. That is, the diodes D1 and D2 and the resistor R1 can divide the reference voltage Vref1 to control the transistor M2 in a stable operation status and to output the bias voltage Vb1 stably.

However, the bias circuits 1141 to 114N are not limited to the embodiment shown in FIG. 6. In some other embodiments, the bias circuits 1141 to 114N can be implemented by different structures. For example, in some embodiments, the first terminal of the transistor M2 can be coupled to the reference voltage terminal for receiving the reference voltage Vref1 instead of coupling to the second system voltage terminal NV2.

In FIG. 6, the amplification circuit 110 can include a plurality of amplifiers 1121 to 112N, and can choose to enable the desired number of amplifiers of the amplifiers 1121 to 112N and adjust the bias voltages received by the amplifiers 1121 to 112N according to which the frequency band the RF signal SIG1 belongs so as to meet the requirement of the operation mode. However, the amplification circuit 110 is not limited to controlling the operation mode by choosing the number of amplifiers to be enabled and adjusting the bias voltage. In some other embodiments, the operation mode of the amplification circuit 110 can be controlled by simply choosing the number of amplifiers 112 to be enabled without adjusting the bias voltage of the enabled amplifiers 112. In contrast, in some embodiments, the amplification circuit can also include one single amplifier, and the operation mode of the amplification circuit can be controlled by adjusting the bias voltage when the amplifier is enabled.

Figure 7:
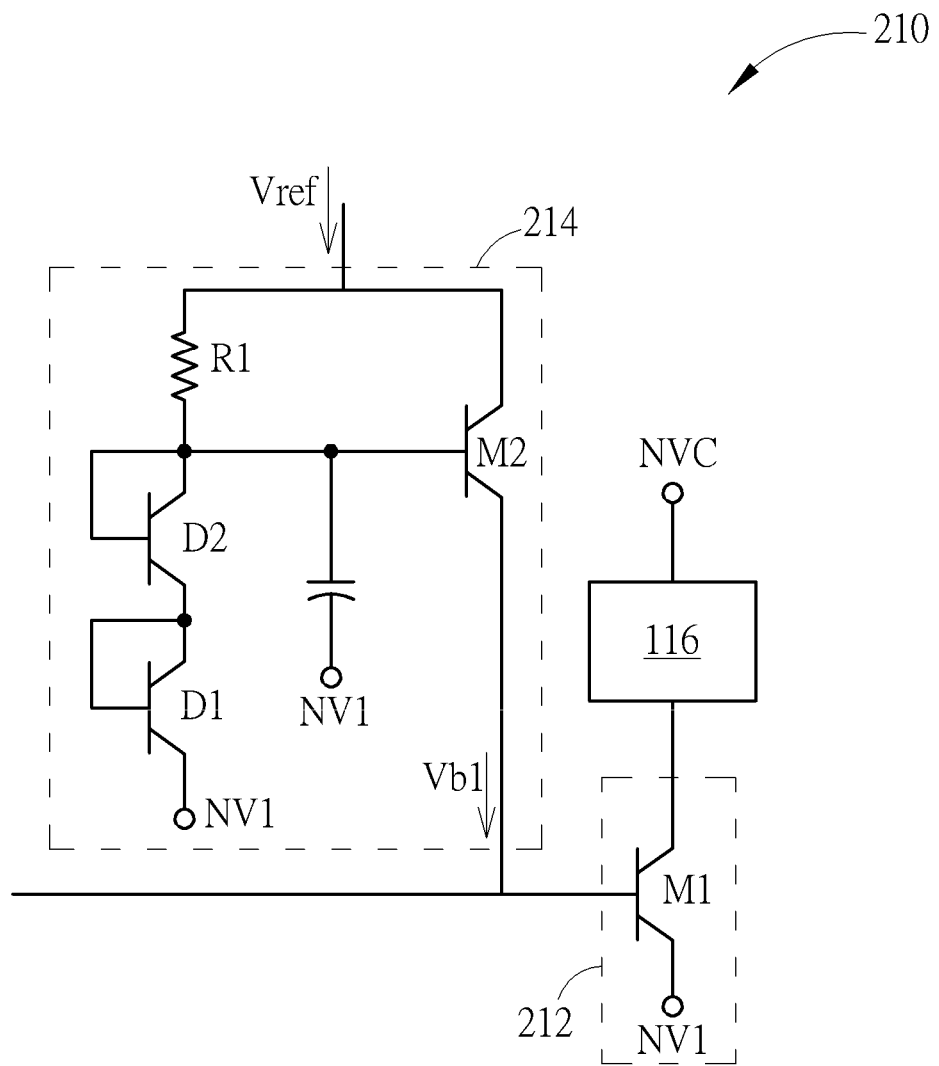
FIG. 7 shows an amplification circuit according to another embodiment of the present invention.

FIG. 7 shows an amplification circuit 210 according to one embodiment of the present invention. The amplification circuit 210 includes an amplifier 212 and a bias circuit 214. The amplification circuits 110 and 210 have similar structures, and can be operated with similar principles. In some embodiments, the amplification circuit 210 can replace the amplification circuit 110 and can be applied in the RF signal amplification device 100. However, since the amplification circuit 210 includes only one amplifier 212, the amplification circuit 210 may adjust its operation mode mainly by adjusting the reference voltage Vref received by the bias circuit 214 according to the frequency band to which the RF signal SIG1 belongs or the operation mode of the RF signal amplification device 100.

Figure 8:
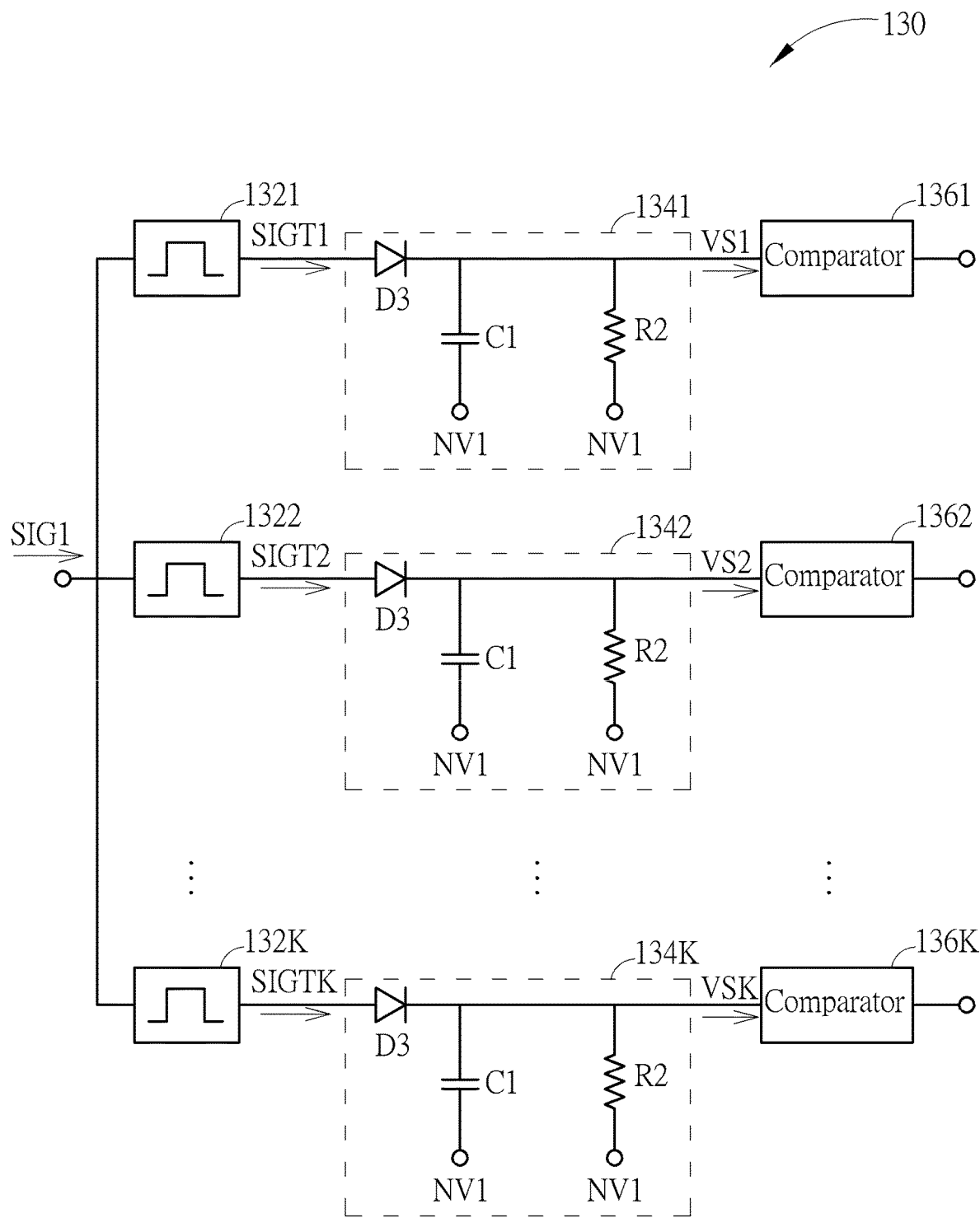
FIG. 8 shows the frequency detection circuit in FIG. 1 according to one embodiment of the present invention.

FIG. 8 shows a frequency detection circuit 130 according to one embodiment of the present invention. The frequency detection circuit 130 can include a plurality of band pass filter circuits 1321 to 132K, a plurality of signal energy sensors 1341 to 134K, and a plurality of comparators 1361 to 136K, where K is an integer greater than 1. The band pass filter circuits 1321 to 132K can receive the RF signal SIG1, and let the signals of the corresponding frequencies pass. The input terminal of each of the signal energy sensors 1341 to 134K can be coupled to a corresponding band pass filter circuit of the band pass filter circuits 1321 to 132K for receiving the testing signal passing through the corresponding band pass filter circuit. For example, the input terminal of the signal energy sensor 1341 can be coupled to the band pass filter circuit 1321 for receiving the testing signal SIGT1 passing through the band pass filter circuit 1321, and the input terminal of the signal energy sensor 134K can be coupled to the band pass filter circuit 132K for receiving the testing signal SIGTK passing through the band pass filter circuit 132K. The signal energy sensors 1341 to 134K can output the sensing voltages according to the intensities of the testing signals.

Each of the comparators 1361 to 136K can be coupled to a corresponding signal energy sensor of the signal energy sensors 1341 to 134K, and can compare the sensing voltage outputted by the corresponding signal energy sensor with a base voltage to output the determination signal for determining the frequency band the RF signal SIG1 belongs to. For example, after the signal energy sensor 1341 outputs the sensing voltage VS1 according to the intensity of the testing signal SIGT1, the comparator 1361 can receive the sensing voltage VS1 generated by the signal energy sensor 1341, and compare the sensing voltage VS1 with the base voltage. Similarly, after the signal energy sensor 134K outputs the sensing voltage VSK according to the intensity of the testing signal SIGTK, the comparator 136K can receive the sensing voltage VSK generated by the signal energy sensor 134K, and compare the sensing voltage VSK with the base voltage. In this case, if the sensing voltage VS1 is greater than the base voltage significantly, it may imply that the testing signal SIGT1 received by the signal energy sensor 1341 is rather intensive. That is, compared with other band pass filter circuits, the center frequency of the band pass filter circuit 1321 may be closer to the frequency band the RF signal SIG1 belongs to. In this case, the frequency detection circuit 130 can determine that the frequency band of the RF signal SIG1 to be the center frequency of the band pass filter circuit 1321, and output the frequency signal corresponding to the frequency band of the RF signal SIG1 to the control circuit 140.

In FIG. 8, the signal energy sensors 1341 to 134K can have the same structure. For example, the signal energy sensor 1341 can include a diode D3, a resistor R2, and a capacitor C1. The diode D3 has a first terminal coupled to the input terminal of the signal energy sensor 1341, and a second terminal. The resistor R2 has a first terminal coupled to the second terminal of the diode D3, and a second terminal coupled to the first system voltage terminal NV1. The capacitor C1 has a first terminal coupled to the second terminal of the diode D3 for outputting the sensing voltage, and a second terminal coupled to the first system voltage terminal NV1. The diode D3 can be used to rectify the testing signal SIGT1 so the capacitor C1 can be charged according to the intensity of the testing signal SIGT1 and output the sensing voltage VS1 later. However, the signal energy sensors 1341 to 134K are not limited by the structure shown in FIG. 8. In some other embodiments, the designer can use other components to implement the signal energy sensors 1341 to 134K.

In some embodiments, the frequency detection circuit 130 can adopt a coupler to receive the RF signal SIG1 for preventing the frequency detection circuit 130 from interfering the amplification of the RF signal SIG1.

Figure 9:
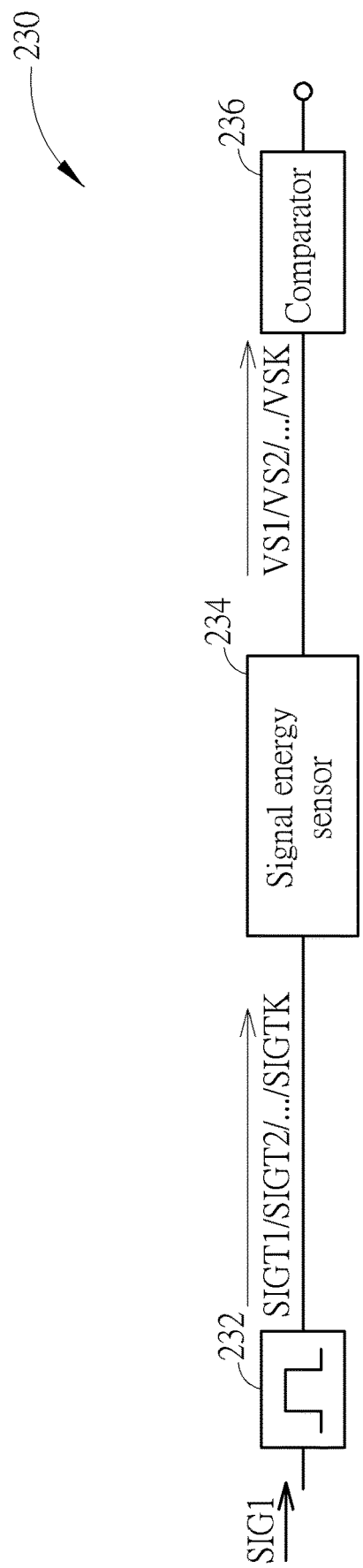
FIG. 9 shows a frequency detection circuit according to another embodiment of the present invention.

Furthermore, in FIG. 8, the frequency detection circuit 130 can compare the intensities of signals of K different frequencies with K band pass filter circuits, K signal energy sensors, and K comparators. However, in some other embodiments, the frequency detection circuit 130 can also detect the intensities of signals of different frequencies sequentially at different times for reducing the required components. FIG. 9 shows a frequency detection circuit 230 according to one embodiment of the present invention. In some embodiments, the frequency detection circuit 230 can be applied to the RF signal amplification device 100 and replace the frequency detection circuit 130.

The frequency detection circuit 230 includes a variable band pass filter circuit 232, a signal energy sensor 234 and a comparator 236. The variable band pass filter circuit 232 can receive the RF signal SIG1 and filter the RF signal SIG1 in a plurality of frequencies. For example, the variable band pass filter circuit 232 can filter the RF signals with K different center frequencies at K different time periods to generate the testing signal SIGT1 to SIGTK respectively. The input terminal of the signal energy sensor 234 can be coupled to the variable band pass filter circuit 232 for receiving the testing signal SIGT1 to SIGTK passing through the variable band pass filter circuit 232, and the signal energy sensor 234 can generate the sensing voltages VS1 to VSK according to the intensities of the testing signal SIGT1 to SIGTK. The comparator 236 can be coupled to the signal energy sensor 234, and can include registers. The comparator 236 can store the sensing voltages VS1 to VSK in the registers, and compare the sensing voltages VS1 to VSK later to output the determination signal for determining the frequency band RF signal SIG1 belongs to. For example, when the comparator 236 determines that the sensing voltage VSK is greater than other sensing voltages significantly, it may imply that the center frequency of the variable band pass filter 232 during the $K^{th}$ period is the closest to the frequency band to which the RF signal SIG1 belongs. Therefore, the comparator 236 can determine the frequency band to which the RF signal SIG1 belongs to accordingly, and output the frequency signal corresponding to the frequency band to which the RF signal SIG1 belongs to the control circuit 140.

Although the frequency detection circuits 130 and 230 both use the band pass filtering technique to determine the frequency band to which the RF signal SIG1 belongs, the frequency detection circuit may also use the phase lock detection circuit to determine the frequency band to which the RF signal SIG1 belongs in some other embodiments.

Figure 10:
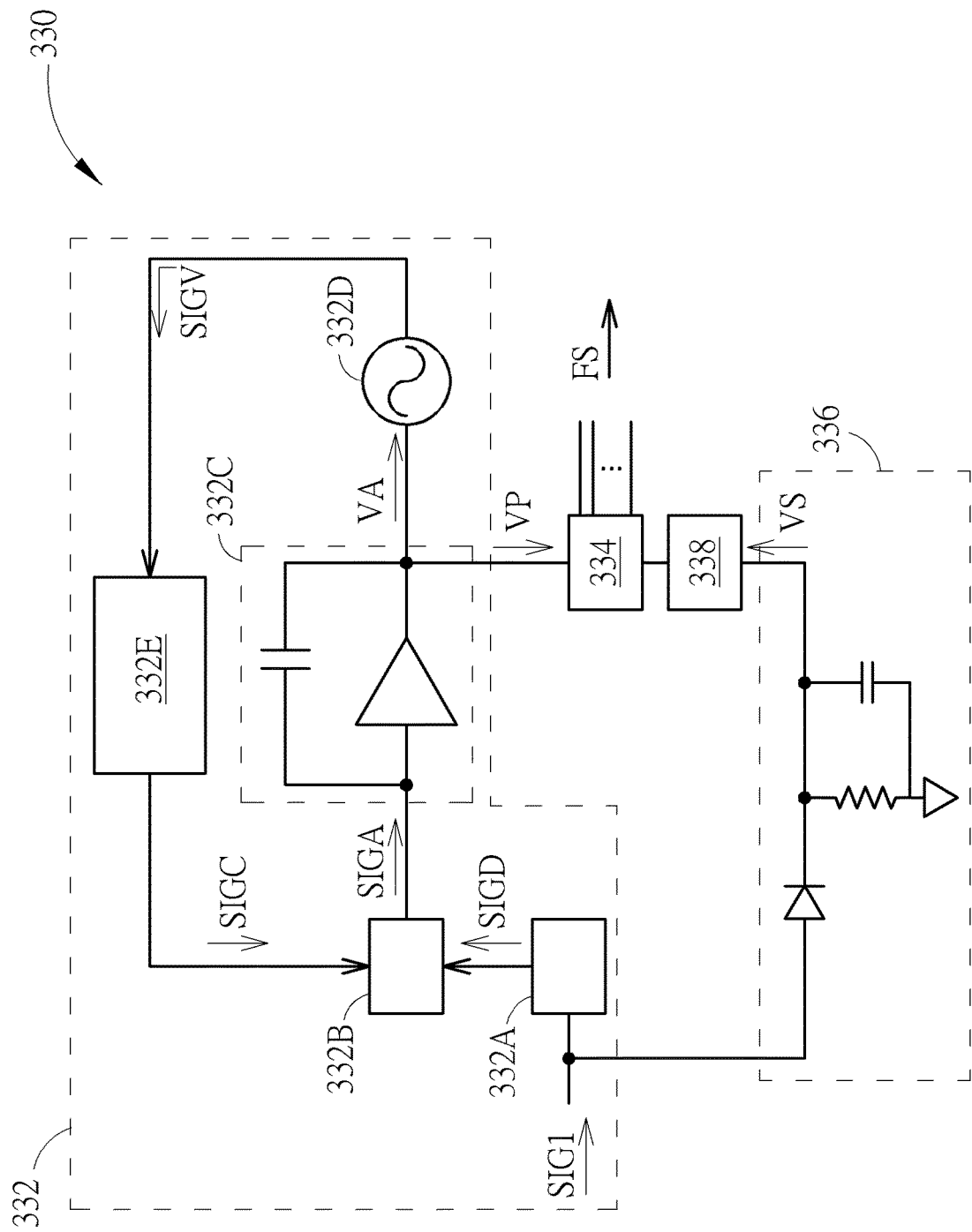
FIG. 10 shows a frequency detection circuit according to another embodiment of the present invention.

FIG. 10 shows a frequency detection circuit 330 according to one embodiment of the present invention. In some embodiments, the frequency detection circuit 330 can be applied to the RF signal amplification device 100 and replace the frequency detection circuit 130.

The frequency detection circuit 330 includes the phase lock detection circuit 332. The phase lock detection circuit 332 can output a phase lock voltage VP according to the frequency of the radio frequency signal SIG1. That is, the phase lock voltage VP can be corresponding to the frequency band to which the RF signal belongs. In FIG. 10 to determine the frequency band corresponding to the phase lock voltage VP, the frequency detection circuit 330 can further include an analog to digital converter 334, and the analog to digital converter 334 can output the corresponding digital signal according to the phase lock voltage VP so the other circuits, such as the control circuit 140, can perform the subsequent operations. However, the frequency detection circuit 330 is not limited to including the analog to digital converter 334 to convert the phase lock voltage VP to a digital signal. In some other embodiments, if the other circuits can operate with the phase lock voltage VP directly, then the frequency detection circuit 330 may omit the analog to digital converter 334. In this case, the phase lock voltage VP would be used as the frequency signal FS and outputted to the control circuit 140.

In addition, the phase lock detection circuit 332 can include a frequency divider 332A, a phase comparator 332B, an integrator 332C, an oscillator 332D, and a frequency demultiplier 332E. The frequency divider 332A can divide the frequency of the RF signal SIG1 to generate a frequency divided signal SIGD. The phase comparator 332B can compare the phases of the frequency divided signal SIGD and a comparison signal SIGC to output an adjustment signal SIGA. The integrator 332C can output an adjustment voltage VA according to the adjustment signal SIGA. The oscillator 332D can output the oscillation signal SIGV according to the adjustment voltage VA. The frequency demultiplier 332E can generate the comparison signal SIGC by demultiplying the oscillation signal SIGV. That is, the phase lock detection circuit 332 can generate the comparison signal SIGC with its frequency approaching the frequency of the frequency divided signal SIGD of the RF signal SIG1, and output the adjustment voltage VA as the phase lock voltage VP when entering the stable status. In some other embodiments, the phase lock detection circuit 332 may choose to output the adjustment signal SIGA, the oscillator signal SIGV, or the comparison signal SIC as the phase lock voltage VP.

In some embodiments, to ensure that the phase lock detection circuit 332 is able to generate the comparator signal SIGC close enough to the frequency divided signal SIGD of the RF signal SIG1, that is, to ensure that the adjustment voltage VA has entered the stable status when outputting the phase lock voltage VP, the frequency detection circuit 330 can further include a signal energy sensor 336 and a delay element 338. The input terminal of the signal energy sensor 336 can receive the RF signal SIG1, and the signal energy sensor 336 can output the sensing voltage VS according to the intensity of the RF signal SIG1. The delay element 338 can be coupled to the signal energy sensor 336 and the analog to digital converter 334. When the sensing voltage VS is greater than a predetermined value, the delay element 338 will wait for a predetermined delay time, that is, wait for the adjustment voltage VA to become stable, and then output the frequency signal FS corresponding to the RF signal SIG1 according to the phase lock voltage VP. For example, the delay element 338 can trigger the analog to digital converter 334 to convert the phase lock voltage VP into a digital signal as the frequency signal FS for outputting to the control circuit 140.

In FIG. 1, the RF signal amplification device 100 can amplify the RF signal SIG1 with one single stage of the amplification circuit 110. However, in some other embodiments, the RF signal amplification device 100 can include more stages of amplification circuit for amplifying the RF signal SIG1.

Figure 11:
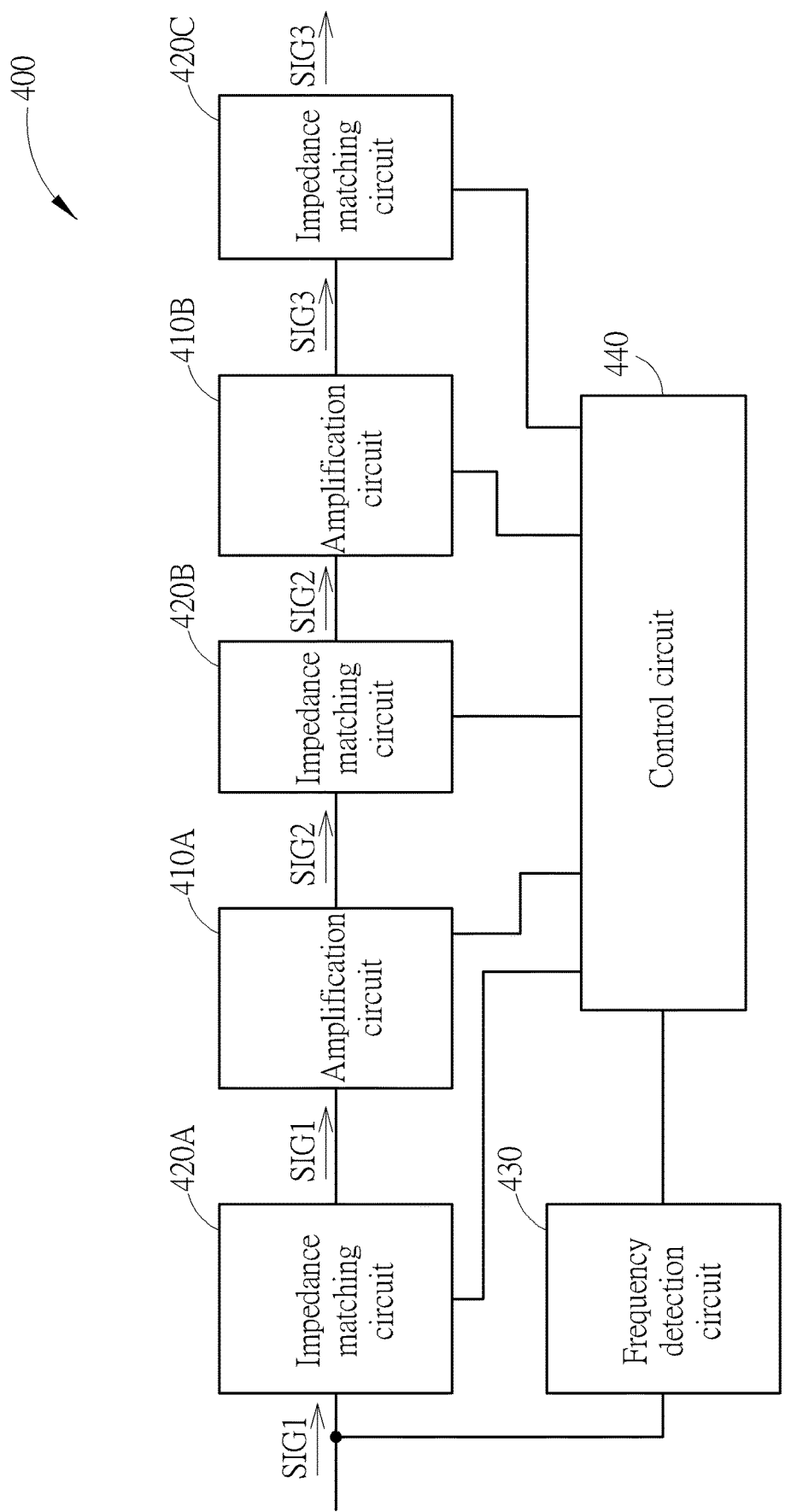
FIG. 11 shows a RF signal amplification device according to another embodiment of the present invention.

FIG. 11 shows a RF signal amplification device 400 according to one embodiment of the present invention. The RF signal amplification devices 100 and 400 have similar structures and can be operated with similar principles. However, the RF signal amplification device 400 can include the amplification circuits 410A and 410B, the impedance matching circuits 420A, 420B, and 420C, the frequency detection circuit 430, and the control circuit 440.

The amplification circuit 410A has an input terminal and an output terminal. The amplification circuit 410A can receive a RF signal SIG1 from its input terminal, and amplify the RF signal SIG1 to output an amplified RF signal SIG2 through its output terminal. The impedance matching circuit 420A can be coupled to the input terminal of the amplification circuit 410A, and can provide the impedance matching the RF signal SIG1 so that the RF signal SIG1 inputted from external can be received smoothly and can be introduced to the input terminal of the amplification circuit 410A. The impedance matching circuit 420B can be coupled to the output terminal of the amplification circuit 410A. The impedance matching circuit 420B can provide the impedance matching the amplified RF signal SIG2 so that the impedance matching circuit 420B can receive the amplified RF signal SIG2 smoothly, and let the amplified RF signal SIG2 pass through. The amplification circuit 410B can be coupled to the impedance matching circuit 420B for receiving the amplified RF signal SIG2 and amplifying the amplified RF signal SIG2 to generate the amplified RF signal SIG3. The impedance matching circuit 420C can receive the amplified RF signal SIG3 and provide the impedance matching the amplified RF signal SIG3.

In FIG. 11, the impedance matching circuits 420A and 420B both include a high pass filter circuit, for example but not limited to, the high pass filter circuit 122A shown in FIG. 2. The impedance matching circuit 420C can include a band pass filter circuit, for example but not limited to, the band pass filter circuit 122B shown in FIG. 3. In this case, the control circuit 440 can adjust the impedances of the impedance matching circuits 420A, 420B, and 420C according to the frequency band to which the RF signal SIG1 belongs, so the RF signal amplification device 400 can adjust the internal parameters according to the frequency band to which the RF signal SIG1 belongs, and thereby receiving the RF signal SIG1 and outputting the amplified RF signal SIG3 smoothly.

Figure 12:
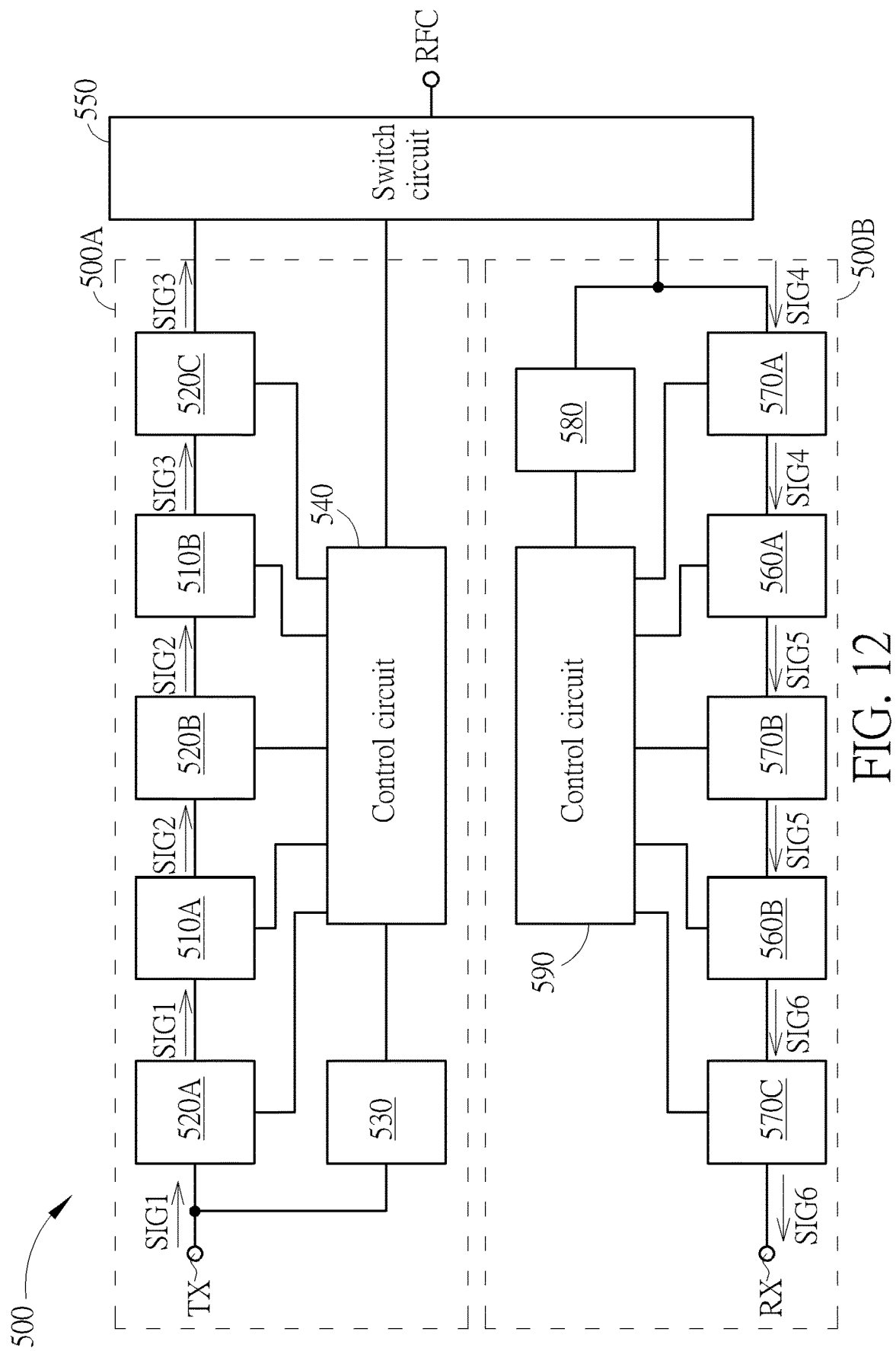
FIG. 12 shows a RF front-end module (FEM) according to one embodiment of the present invention.

FIG. 12 shows a RF front-end module (FEM) 500 according to one embodiment of the present invention. The RF front-end module 500 includes a transmitting terminal TX, a receiving terminal RX, a common terminal RFC, a switch circuit 550, and RF signal amplification devices 500A and 500B. The switch circuit 550 is coupled to the transmitting terminal TX, the receiving terminal RX, and the common terminal RFC, and can selectively couple the common terminal RFC to the transmitting terminal TX or the receiving terminal RX. The RF signal amplification device 500A can be coupled between the switch circuit 550 and the transmitting terminal TX, and the RF signal amplification device 500B can be coupled between the switch circuit 550 and the receiving terminal RX.

In some other embodiments, the RF front-end module 500 may omit one of the two RF signal amplification devices, for example, the RF signal amplification device 500A coupled between the switch circuit 550 and the transmitting terminal TX can be omitted, or the RF signal amplification device 500B coupled between the switch circuit 550 and the receiving terminal RX can be omitted. Also, in some other embodiments, the amplification circuit can be used to replace one of the RF signal amplification device. For example, the amplification circuit 510A or 510B can replace the RF signal amplification device 500A coupled between the switch circuit 550 and the transmitting terminal TX, or the amplification circuit 560A or 560B can replace the RF signal amplification device 500B coupled between the switch circuit 550 and the receiving terminal RX. In some other embodiments, the RF signal amplification device 500A or 500B can have the similar structures and the similar operation principles as the RF signal amplification device 100.

In the present embodiment, the RF signal amplification device 500A or 500B can also have the similar structure and the similar operation principles as the RF signal amplification device 400. The RF signal amplification device 500A includes the amplification circuits 510A and 510B, the impedance matching circuits 520A, 520B, and 520C, the frequency detection circuit 530, and the control circuit 540. The input terminal of the amplification circuit 510A can be coupled to the transmitting terminal TX through the impedance matching circuit 520A, and the output terminal of the amplification circuit 510A can be coupled to the switch circuit 550 through the impedance matching circuit 520B, the amplification circuit 510B, and the impedance matching circuit 520C. The RF signal amplification device 500B includes the amplification circuits 560A and 560B, the impedance matching circuits 570A, 570B, and 570C, the frequency detection circuit 580, and the control circuit 590. The input terminal of the amplification circuit 560A can be coupled to the switch circuit 550 through the impedance matching circuit 570A, and the output terminal of the amplification circuit 560A can be coupled to the receiving terminal RX through the impedance matching circuit 570B, the amplification circuit 560B, and the impedance matching circuit 570C.

In FIG. 12, the RF front-end module 500 can use the switch circuit 550 to switch the transmission direction of the RF signals, so that the transmitting terminal TX and the receiving terminal RX can share the same antenna module through the common terminal RFC. The control circuit 540 can control the switch circuit 550 according to the RF signal SIG1 so the common terminal RFC can be selectively coupled to the transmitting terminal TX through the output terminal of the amplification circuit 510A or coupled to the receiving terminal RX through the input terminal of the amplification circuit 560A. The switch circuit 550 can be a single-pole double-throw (SP2T) switch.

For example, the amplification circuits 510A and 510B can be power amplifiers, and the RF signal SIG1 can be inputted to the transmitting terminal TX. In this case, the amplification circuit 510A will amplify the RF signal SIG1 to generate the amplified RF signal SIG2, and the amplification circuit 510B will further generate the amplified RF signal SIG3 according to the amplified RF signal SIG2 to. The amplified RF signal SIG3 is then transmitted to the common terminal RFC for the antenna module through the switch circuit 550.

In contrast, the amplification circuits 560A and 560B can be low noise amplifiers, and the RF signal SIG6 can be outputted through the receiving terminal RX. In this case, the switch circuit 550 can pass the RF signal SIG4 received from the antenna module through the common terminal RFC to the RF signal amplification device 500B. In this case, the frequency detection circuit 580 will determine the frequency band to which the RF signal SIG4 belongs, and the control circuit 590 will adjust the impedances of the impedance matching circuits 570A, 570B, and 570C according to the frequency band to which the RF signal SIG4 belongs. Therefore, the amplification circuit 560A can receive the RF signal SIG4 smoothly and generate the amplified RF signal SIG5 accordingly, and the amplification circuit 560B can receive the amplified RF signal SIG5 smoothly and generate the amplified RF signal SIG6 for the subsequent circuits to analyze the information residing in the RF signals.

In FIG. 12, the switch circuit 550 can be controlled by the control circuit 540. For example, when the frequency detection circuit 530 detects the input of the RF signal SIG1 or determines that the frequency band of the RF signal SIG1 belongs to a predetermined frequency band, the control circuit 540 can correspondingly control the switch circuit 550 so that the amplified RF signal SIG3 can be transmitted to the common terminal RFC through the switch circuit 550, and the RF signal amplification device 500 can perform operation as a transmitting terminal.

Otherwise, when the frequency detection circuit 530 does not detect the input of the RF signal SIG1 or determines that the frequency band of the RF signal SIG1 does not belong to the predetermined frequency band, the control circuit 540 can correspondingly control the switch circuit 550 to block the electrical connection between the impedance matching circuit 520C and the common terminal RFC, and form the electrical connection between the impedance matching circuit 570A and the common terminal RFC. Therefore, the amplification circuit 560A can receive the RF signal SIG4 from the common terminal RFC, and the RF signal amplification device 500 can perform operations as a receiving terminal.

In summary, the RF signal amplification device and the RF front-end module provided by the embodiments of the present invention can detect the frequency band to which the RF signal belongs with the frequency detection circuit, and adjust the impedance of the impedance matching circuit according to the frequency band of the RF signal. Therefore, the RF signal amplification device can support RF signals of different frequency bands flexibly, the hardware components required can be reduced, and the redundant redesign process can be simplified. In addition, in some embodiments of the present invention, the RF signal amplification device and the RF front-end module can further adjust the number of amplifiers to be enabled in the amplification circuit or adjust the bias voltage received by the amplifiers according to the frequency band to which the RF signal belongs, so that the power and the linearity of the amplification circuit can meet the requirement of the application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency signal amplification device comprising:
    a first amplification circuit having an input terminal, an output terminal, and a plurality of amplifiers and configured to amplify a radio frequency (RF) signal received from the input terminal, and generate a first amplified radio frequency signal to the output terminal;
    a first impedance matching circuit coupled to the input terminal or the output terminal of the first amplification circuit, and configured to receive the radio frequency signal and provide an impedance matching the radio frequency signal, or receive the first amplified radio frequency signal and provide an impedance matching the first amplified radio frequency signal;
    a frequency detection circuit configured to determine a frequency band the radio frequency signal belongs to; and
    a control circuit configured to adjust the impedance of the first impedance matching circuit according to the frequency band, and is further configured to enable a predetermined number of amplifiers in the first amplification circuit according to the frequency band and/or an operation mode of the radio frequency signal amplification device.

2. The radio frequency signal amplification device of claim 1, wherein the first amplification circuit comprises:
    a plurality of amplifiers; and
    a plurality of bias circuits configured to provide a plurality of bias voltages required by the plurality of amplifiers according to a plurality of reference voltages;
    wherein the control circuit enables the plurality of amplifiers by providing the plurality of reference voltages required by the plurality of bias circuits, and is further configured to adjust voltage values of the plurality of reference voltages received by the plurality of bias circuits according to the frequency band and/or an operation mode of the radio frequency signal amplification device.

3. The radio frequency signal amplification device of claim 2, wherein at least two bias circuits of the plurality of bias circuits receive different reference voltages so as to enable two corresponding amplifiers of the plurality of amplifiers.

4. The radio frequency signal amplification device of claim 1, wherein the first amplification circuit comprises:
    at least one amplifier; and
    at least one bias circuit configured to provide at least one bias voltage required by the at least one amplifier according to at least one reference voltage;
    wherein the control circuit is further configured to adjust a voltage value of the at least one reference voltage received by the at least one bias circuit according to the frequency band and/or an operation mode of the radio frequency signal amplification device.

5. The radio frequency signal amplification device of claim 1, wherein the first impedance matching circuit is coupled to the input terminal of the first amplification circuit, and configured to receive the radio frequency signal and provide the impedance matching the radio frequency signal, and the radio frequency signal amplification device further comprises:
    a second impedance matching circuit coupled to the output terminal of the first amplification circuit, and configured to receive the first amplified radio frequency signal and provide an impedance matching the first amplified radio frequency signal;
    wherein the control circuit is further configured to adjust the impedance of the second impedance matching circuit according to the frequency band.

6. The radio frequency signal amplification device of claim 5, wherein the first impedance matching circuit comprises a high pass filter circuit, and the second impedance matching circuit comprises a band pass filter circuit.

7. The radio frequency signal amplification device of claim 5, further comprising:
    a second amplification circuit coupled to the second impedance matching circuit for receiving the first amplified radio frequency signal, and configured to amplify the first amplified radio frequency signal to generate a second amplified radio frequency signal; and
    a third impedance matching circuit configured to receive the second amplified radio frequency signal and provide an impedance matching the second amplified radio frequency signal;
    wherein the control circuit adjusts the impedance of the first impedance matching circuit, the impedance of the second impedance matching circuit, and the impedance of the third impedance matching circuit according to the frequency band.

8. The radio frequency signal amplification device of claim 7, wherein the first impedance matching circuit comprises a first high pass filter circuit, the second impedance matching circuit comprises a second high pass filter circuit, and the third impedance matching circuit comprises a band pass filter circuit.

9. The radio frequency signal amplification device of claim 1, wherein the first impedance matching circuit comprises:
    an input terminal;
    an output terminal; and
    a first variable capacitor having a first terminal coupled between the input terminal of the first impedance matching circuit and the output terminal of the first impedance matching circuit, and a second terminal coupled to a first system voltage terminal;
    wherein the control circuit is further configured to adjust the first variable capacitor according to the frequency band.

10. The radio frequency signal amplification device of claim 1, wherein the first impedance matching circuit comprises:
    an input terminal;
    an output terminal; and a first variable capacitor having a first terminal coupled to the input terminal of the first impedance matching circuit, and a second terminal coupled to the output terminal of the first impedance matching circuit;
wherein the control circuit is further configured to adjust the first variable capacitor according to the frequency band.

11. The radio frequency signal amplification device of claim 1, wherein the frequency detection circuit comprises:
a plurality of band pass filter circuits configured to receive the radio frequency signal;
a plurality of signal energy sensors each having an input terminal coupled to a corresponding band pass filter circuit of the plurality of band pass filter circuits for receiving a testing signal passing through the corresponding band pass filter circuit, and configured to output a sensing voltage according to an intensity of the testing signal; and
a plurality of comparators each coupled to a corresponding signal energy sensor of the plurality of signal energy sensors, and configured to compare a sensing voltage outputted by the corresponding signal energy sensor with a base voltage to output a determination signal for determining the frequency band the radio frequency signal belongs to.

12. The radio frequency signal amplification device of claim 1, wherein the frequency detection circuit comprises:
a variable band pass filter circuit configured to receive the radio frequency signal and filter the radio frequency signal with a plurality of band frequencies;
a signal energy sensor having an input terminal coupled to the variable band pass filter circuit for receiving a plurality of testing signals passing through the variable band pass filter circuit, and configured to output a plurality of sensing voltages according to intensities of the plurality of testing signals; and
a comparator coupled to the signal energy sensor, and configured to output a determination signal by comparing the plurality of testing signals for determining the frequency band the radio frequency signal belongs to.

13. The radio frequency signal amplification device of claim 1, wherein the frequency detection circuit comprises:
a phase lock detection circuit configured to output a phase lock voltage according to a frequency of the radio frequency signal, wherein the phase lock voltage is corresponding to the frequency band the radio frequency signal belongs to.

14. The radio frequency signal amplification device of claim 13, wherein the phase lock detection circuit comprises:
a frequency divider configured to divide the frequency of the radio frequency signal to generate a frequency divided signal;
a phase comparator configured to compare phases of the frequency divided signal and a comparison signal to output an adjustment signal;
an integrator configured to output an adjustment voltage according to the adjustment signal;
an oscillator configured to output an oscillation signal according to the adjustment voltage; and
a frequency demultiplier configured to generate the comparison signal by demultiplying the oscillation signal.

15. The radio frequency signal amplification device of claim 14, wherein the phase lock detection circuit outputs the adjustment voltage as the phase lock voltage.

16. The radio frequency signal amplification device of claim 13, wherein the frequency detection circuit further comprises:
a signal energy sensor having an input terminal configured to receive the radio frequency signal, and the signal energy sensor is configured to output a sensing voltage according to an intensity of the radio frequency signal; and
a delay element coupled to the signal energy sensor, and configured to output a frequency signal according to the phase lock voltage after a predetermined time when the sensing voltage is greater than a predetermined value, wherein the frequency signal is corresponding to the frequency band of the radio frequency signal.

17. The radio frequency signal amplification device of claim 12, wherein the signal energy sensor comprising:
a diode having a first terminal coupled to the input terminal of the signal energy sensor, and a second terminal; and
a resistor having a first terminal coupled to the second terminal of the diode, and a second terminal coupled to a first system voltage terminal; and
a capacitor having a first terminal coupled to the second terminal of the diode and for outputting the sensing voltage, and a second terminal coupled to the first system voltage terminal.

18. The radio frequency signal amplification device of claim 1, wherein the control circuit is further configured to adjust a gain, a harmonic filtering frequency, or a noise filtering frequency of the radio frequency signal amplification device according to the frequency band.

19. A radio frequency front-end module comprising:
a transmitting terminal;
a receiving terminal;
a common terminal;
a switch circuit coupled to the transmitting terminal, the receiving terminal, and the common terminal, and configured to selectively couple the common terminal to the transmitting terminal or the receiving terminal; and
a radio frequency signal amplification device coupled between the switch circuit and the transmitting terminal or between the switch circuit and the receiving terminal, and the radio frequency signal amplification device comprising:
an amplification circuit having an input terminal and an output terminal, and configured to amplify a radio frequency (RF) signal received from the input terminal, and generate an amplified radio frequency signal to the output terminal;
an impedance matching circuit coupled to the input terminal of the amplification circuit and configured to receive the radio frequency signal and provide an impedance matching the radio frequency signal, or the impedance matching circuit coupled to the output terminal of the amplification circuit and configured to receive the amplified radio frequency signal and provide an impedance matching the amplified radio frequency signal;
a frequency detection circuit configured to determine a frequency band the radio frequency signal belongs to; and
a control circuit configured to adjust the impedance of the impedance matching circuit according to the frequency band.

20. The radio frequency front-end module of claim 19, wherein:

the radio frequency amplification device is coupled between the switch circuit and the transmitting terminal;

the input terminal of the amplification circuit is coupled to the transmitting terminal, and the output terminal of the amplification circuit is coupled to the switch circuit; and the control circuit is further configured to control the switch circuit according to the radio frequency signal, and selectively couple the common terminal to the output terminal or the receiving terminal.

21. The radio frequency front-end module of claim 19, wherein:

the radio frequency amplification device is coupled between the switch circuit and the receiving terminal;

the input terminal of the amplification circuit is coupled to the switch circuit, and the output terminal of the amplification circuit is coupled to the receiving terminal.

22. A radio frequency signal amplification device comprising:

a first amplification circuit comprising:
  an input terminal;
  an output terminal;
  at least one amplifier; and
  at least one bias circuit configured to provide at least one bias voltage required by the at least one amplifier according to at least one reference voltage;
  wherein the first amplification circuit is configured to amplify a radio frequency (RF) signal received from the input terminal, and generate a first amplified radio frequency signal to the output terminal;

a first impedance matching circuit coupled to the input terminal or the output terminal of the first amplification circuit, and configured to receive the radio frequency signal and provide an impedance matching the radio frequency signal, or receive the first amplified radio frequency signal and provide an impedance matching the first amplified radio frequency signal;

a frequency detection circuit configured to determine a frequency band the radio frequency signal belongs to; and a control circuit configured to adjust the impedance of the first impedance matching circuit according to the frequency band and the control circuit is further configured to adjust a voltage value of the at least one reference voltage received by the at least one bias circuit according to the frequency band and/or an operation mode of the radio frequency signal amplification device.

23. A radio frequency signal amplification device comprising:

a first amplification circuit having an input terminal and an output terminal, and configured to amplify a radio frequency (RF) signal received from the input terminal, and generate a first amplified radio frequency signal to the output terminal;

a first impedance matching circuit coupled to the input terminal or the output terminal of the first amplification circuit, the first impedance matching circuit configured to receive the radio frequency signal and provide an impedance matching the radio frequency signal, or receive the first amplified radio frequency signal and provide an impedance matching the first amplified radio frequency signal, and the first impedance matching circuit comprising:

an input terminal;
  an output terminal; and
  a first variable capacitor having a first terminal coupled between the input terminal of the first impedance matching circuit and the output terminal of the first impedance matching circuit, and a second terminal coupled to a first system voltage terminal or
  the first variable capacitor having a first variable capacitor having a first terminal coupled to the input terminal of the first impedance matching circuit, and a second terminal coupled to the output terminal of the first impedance matching circuit;

a frequency detection circuit configured to determine a frequency band the radio frequency signal belongs to; and a control circuit configured to adjust the impedance of the first impedance matching circuit according to the frequency band and the control circuit further configured to adjust the first variable capacitor according to the frequency band.

* * * * *